(12) United States Patent  (10) Patent No.: US 7,910,445 B2
Onoda  (45) Date of Patent: Mar. 22, 2011

(54) SEMICONDUCTOR DEVICE AND METHOD OF FABRICATING THE SAME

(75) Inventor: Hiroyuki Onoda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/252,152

(22) Filed: Oct. 15, 2008

(65) Prior Publication Data

US 2009/0140302 A1   Jun. 4, 2009

(30) Foreign Application Priority Data

Oct. 16, 2007   (JP) ................................ 2007-268591

(51) Int. Cl.
*H01L 21/336* (2006.01)
(52) U.S. Cl. ................ 438/285; 438/300; 257/E21.431; 257/E21.093
(58) Field of Classification Search ................... 438/285, 438/300, FOR. 197; 257/E21.431, E21.093
See application file for complete search history.

(56) References Cited

U.S. PATENT DOCUMENTS

| | | | | |
|---|---|---|---|---|
| 6,924,518 B2* | 8/2005 | Iinuma et al. | ................. | 257/284 |
| 7,057,216 B2* | 6/2006 | Ouyang et al. | ................. | 257/194 |
| 7,652,328 B2* | 1/2010 | Yamasaki et al. | ............. | 257/330 |
| 7,772,676 B2* | 8/2010 | Han et al. | ...................... | 257/616 |
| 2006/0138398 A1 | 6/2006 | Shimamune et al. | | |
| 2007/0164364 A1* | 7/2007 | Kawasaki | ...................... | 257/368 |
| 2007/0235802 A1* | 10/2007 | Chong et al. | .................... | 257/346 |
| 2009/0020820 A1* | 1/2009 | Baik et al. | ..................... | 257/369 |
| 2009/0085125 A1* | 4/2009 | Kim et al. | ...................... | 257/369 |
| 2009/0095992 A1* | 4/2009 | Sanuki et al. | .................. | 257/288 |
| 2009/0170256 A1* | 7/2009 | Chakravarthi et al. | ........ | 438/217 |
| 2009/0236633 A1* | 9/2009 | Chuang et al. | ................. | 257/190 |
| 2009/0258463 A1* | 10/2009 | Kim et al. | ...................... | 438/142 |
| 2010/0123198 A1* | 5/2010 | Kim et al. | ...................... | 257/377 |
| 2010/0148217 A1* | 6/2010 | Simonelli et al. | ............. | 257/192 |

FOREIGN PATENT DOCUMENTS

JP   2006-186240 A   7/2006

* cited by examiner

*Primary Examiner* — George Fourson
(74) *Attorney, Agent, or Firm* — Foley & Lardner LLP

(57) ABSTRACT

A method of fabricating a semiconductor device according to one embodiment of the invention includes: forming a gate electrode on a semiconductor substrate through a gate insulating film; forming offset spacers on side surfaces of the gate electrode, respectively; etching the semiconductor substrate with a channel region below the offset spacers and the gate electrode being left by using the offset spacers as a mask; forming a first epitaxial layer made of a crystal having a lattice constant different from that of a crystal constituting the semiconductor substrate on the semiconductor substrate thus etched; etching at least a portion of the first epitaxial layer adjacent to the channel region to a predetermined depth from a surface of the first epitaxial layer toward the semiconductor substrate side; and forming a second epitaxial layer containing therein a conductivity type impurity on the first epitaxial layer thus etched.

13 Claims, 12 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-268591, filed on Oct. 16, 2007, the entire contents of which are incorporated herein by reference.

BACKGROUND

A method of fabricating a semiconductor device in which trenches corresponding to a source region and a drain region, respectively, are formed in a Si substrate, a plurality of facets are provided on each of sidewall surfaces of the trenches thus formed, and a SiGe mixed crystal layer is epitaxially grown in each of the trenches each having a plurality of facets on a sidewall surface thereof to be filled therein is described as a conventional method of fabricating a semiconductor device in Japanese Patent KOKAI No. 2006-186240. According to the method of fabricating a semiconductor device described in Japanese Patent KOKAI No. 2006-186240, a plurality of facets are provided on each of the sidewall surfaces of the trenches, which results in that a compressive stress applied to a channel region can be optimized, thereby improving an operation speed of the semiconductor device.

BRIEF SUMMARY

A method of fabricating a semiconductor device according to one embodiment of the invention includes: forming a gate electrode on a semiconductor substrate through a gate insulating film; forming offset spacers on side surfaces of the gate electrode, respectively; etching the semiconductor substrate with a channel region below the offset spacers and the gate electrode being left by using the offset spacers as a mask; forming a first epitaxial layer made of a crystal having a lattice constant different from that of a crystal constituting the semiconductor substrate on the semiconductor substrate thus etched; etching at least a portion of the first epitaxial layer adjacent to the channel region to a predetermined depth from a surface of the first epitaxial layer toward the semiconductor substrate side; and forming a second epitaxial layer containing therein a conductivity type impurity on the first epitaxial layer thus etched.

In addition, a semiconductor device according to another embodiment of the invention includes: a semiconductor substrate; a gate electrode formed on the semiconductor substrate through a gate insulating film; a channel region formed in a portion of the semiconductor substrate below the gate electrode; first epitaxial layers formed on both sides of the channel region, respectively, so as to be adjacent to the channel region, each of the first epitaxial layers serving to generate a strain in the channel region; second epitaxial layers formed on the first epitaxial layers, respectively, on the both sides of the channel region so as to contact the channel region, and formed so as to contain therein a conductivity type impurity.

DETAILED DESCRIPTION

Figure 1:
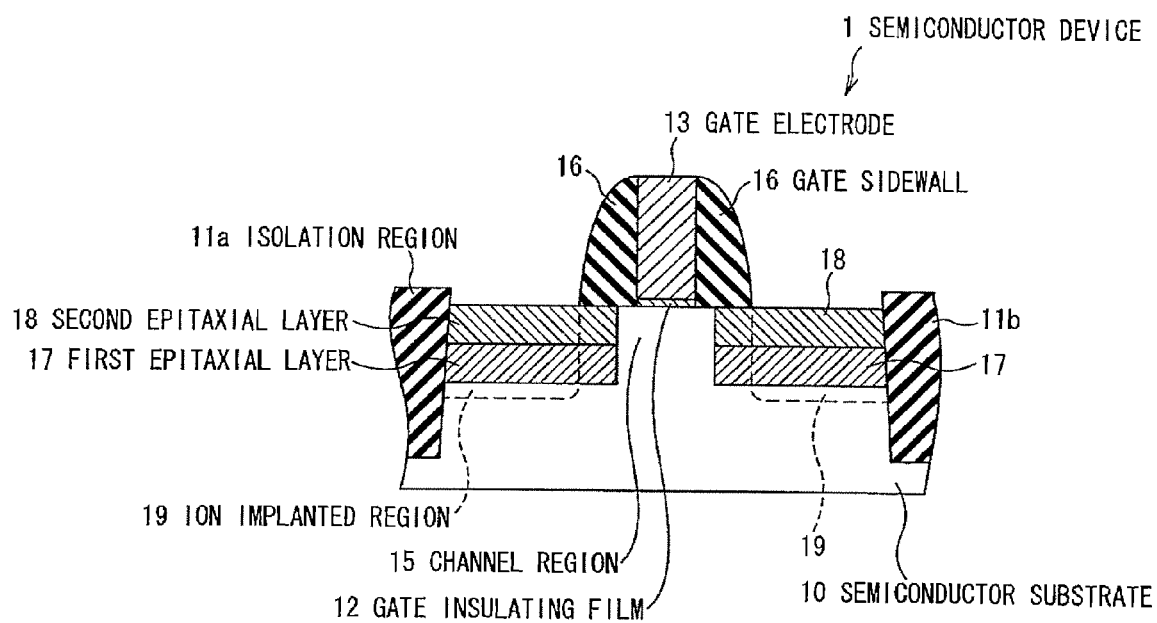
FIG. 1 is a cross sectional view of a semiconductor device according to an embodiment of the invention.

FIG. 1 shows a cross sectional view of a semiconductor device according to an embodiment of the invention.

A semiconductor device according to the embodiment includes a gate electrode 13 formed in a predetermined position on a semiconductor substrate 10 through a gate insulating film 12, gate sidewalls 16 formed on side surfaces of the gate electrode 13, respectively, so as to sandwich the gate electrode 13 between them, a channel region 15 formed below the gate electrode 13, first epitaxial layers 17 and second epitaxial layers 18 formed so as to be filled in recess portions 14, respectively, which will be described later and which are formed on both sides of the channel region 15, respectively, in order from the semiconductor substrate 10 side, ion implanted regions 19 each functioning as a source/drain region, and isolation regions 11a and an isolation region 11b formed in the semiconductor substrate 10.

The semiconductor substrate 10 is constituted by a Si substrate a principal surface of which, for example, has a (100) surface orientation, and which has a predetermined thickness.

The gate electrode 13 is made of a semiconductor crystal containing therein a predetermined conductivity type impurity. Specifically, the gate electrode 13 can be made of polycrystalline Si or polycrystalline SiGe containing therein a conductivity type impurity. With regard to the conductivity type impurity, an ion of a p-type impurity such as B or $BF_2$ can be used in the case of an impurity of a p-type conductivity, and an ion of an n-type impurity such as As or P can be used in the case of an impurity of an n-type conductivity.

In addition, the gate electrode 13 can also be formed in the form of a metal gate electrode. That is to say, the gate electrode 13 can also be made of a metallic material selected from the group consisting of W, Ta, Ti, Hf, Zr, Ru, Pt, Ir, Mo, Al, and the like, or an alloy material containing therein at least one metallic material selected from the group consisting of W, Ta, Ti, Hf, Zr, Ru, Pt, Ir, Mo, Al, and the like. In addition thereto, the gate electrode 13 can also be formed by laminating the metal gate electrode, and an electrode made of a semiconductor crystal.

The gate insulating film 12 is formed in a predetermined region on a surface of the semiconductor substrate 10, and insulates the gate electrode 13 and the semiconductor substrate 10 from each other. The gate insulating film 12 can be made of an insulating material or high dielectric (high-k) material. $SiO_2$, SiN, SiON or the like, for example, can be used as the insulating material. In addition, a Hf system material such as HfSiON, HfSiO or HfO, a Zr system material such as ZrSiON, ZrSiO, or ZrO, or a Y system material such as $Y_2O_3$ can be used as the high dielectric material.

The gate sidewalls 16 are formed so as to contact surfaces of the sidewalls of the gate electrode 13, respectively, and so as to contact a part of the semiconductor substrate 10 right above the channel region 15, and a part of a surface of the second epitaxial layer 18. Each of the gate sidewalls 16 is made of an insulating material. Thus, each of the gate sidewalls 16, for example, is made of SiN, $SiO_2$, Tetraethoxysilane (TEOS), or the like. Each of the gate sidewalls 16 can be formed to have a multilayer structure containing therein a plurality kind of insulating materials. In addition, each of the gate sidewalls 16 is formed so that a distance between an inner surface of each of the gate sidewalls 16 contacting the gate electrode 13, and an outer surface of each of the gate sidewalls 16, that is, a width of each of the gate sidewalls 16 becomes about 30 nm.

Each of the first epitaxial layer 17 is formed so that one side surface thereof contacts the semiconductor substrate 10. Each of the first epitaxial layer 17 is made of a material having a lattice constant different from that of the material of which the semiconductor substrate 10 is made, and generates a predetermined strain in the channel region 10. As a result, each of the first epitaxial layers 17 improves a carrier mobility in the channel region 15. Specifically, each of the first epitaxial layers 17 is made of SiGe when the semiconductor substrate 10 is made of Si. A conductivity type impurity is contained in neither of portions of the first epitaxial layers 17 which are included in neither of the ion implanted regions 19. However, a conductivity type impurity may diffuse from either the second epitaxial layers 18 contacting the first epitaxial layers 17, respectively, or the ion implanted regions 19 into the first epitaxial layers 17. In this case, however, it can be said that the first epitaxial layer 17 substantially contains therein no conductivity type impurity because the conductivity type impurity diffuses at a low concentration. As an example, each of the first epitaxial layers 17 is formed so as to have a thickness of about 75 nm. In addition, each of the first epitaxial layers 17 functions as a part of a source/drain region because a part thereof overlaps the ion implantation region 19.

When the lattice constant of the material of which each of the first epitaxial layers 17 is made is larger than that of the material of which the semiconductor substrate 10 is made, each of the first epitaxial layers 17 applies a compressive strain to the channel region 15. As a result, the mobility of holes in the channel region is improved. On the other hand, when the lattice constant of the material of which each of the first epitaxial layers 17 is made is smaller than that of the material of which the semiconductor substrate 10 is made, the first epitaxial layer 17 applies a tensile strain to the channel region 15. As a result, the mobility of electrons in the channel region is improved.

It is noted that each of the first epitaxial layers 17 can also be formed as a graded layer in which a relative proportion of Ge gradually changes from the semiconductor substrate 10 side toward the gate electrode 13 side. For example, each of the first epitaxial layers 17 can be formed so that the relative proportion of Ge gradually increases in a growth direction from the semiconductor substrate 10 side.

The second epitaxial layers 18 are formed on the first epitaxial layers 17, respectively. In this case, each of the second epitaxial layers 18 is formed so that one side surface thereof contacts the semiconductor substrate 10. In this embodiment, each of the second epitaxial layers 18 is formed so as to contain therein an impurity having a predetermined concentration, and portions of the second epitaxial layers 18 which are included in neither of the ion implanted regions 19 function as source/drain extension regions, respectively. A conductivity type impurity contained in each of the portions of the second epitaxial layers 18 each functioning as the source/drain extension region has a higher concentration than that of each of portions of the first epitaxial layers 17 which are included in the ion implantation regions 19, respectively. The conductivity type impurity contained in each of the second epitaxial layers 18 is a p-type impurity ion in the case of a p-channel transistor, and is an n-type impurity ion in the case of an n-channel transistor. In addition, the second epitaxial layers 18 function as parts of the source/drain regions because parts thereof overlap the ion implanted regions 19, respectively, similarly to the case of the first epitaxial layers 17.

As an example, the second epitaxial layer 18 in this embodiment is formed by implanting B as the p-type impurity at a predetermined concentration. Also, the second epitaxial layer 18 is determined in thickness thereof in accordance with short channel characteristics, and for example, is formed so as to have a thickness in the range of 15 to 20 nm. The second epitaxial layer 18, as an example, is formed so as to have a thickness of about 15 nm. The conductivity type impurity contained in the second epitaxial layer 18 is implanted in situ in a phase of the crystal growth of the second epitaxial layer 18. Therefore, an impurity concentration profile in a junction interface is steep and thus the excellent short channel characteristics are obtained as compared with the case where the implantation of the conductivity type impurity ions is performed after completion of the crystal growth by utilizing the ion implantation method or the like.

The ion implantation regions 19 are formed by implanting predetermined conductivity type impurity ions into the semiconductor substrate 10, the first epitaxial layers 17, and the second epitaxial layers 18 at a predetermined concentration for the purpose of forming the source/drain regions by using the gate sidewalls 16 as a mask. Here, the concentration of the conductivity type impurity thus implanted is higher than that of the conductivity type impurity contained in each of the second epitaxial layers 18. P-type impurity ions or n-type impurity ions are given as the conductivity type impurity ions.

Each of the isolation region 11a and the isolation 11b is made of an insulating material. As an example, each of the isolation region 11a and the isolation 11b is made of $SiO_2$. Specifically, each of the isolation region 11a and the isolation 11b is formed to have a Shallow Trench Isolation (STI) structure.

It is noted that a silicide layer can also be formed on an upper surface of the gate electrode 13. For example, the silicide layer is made of a compound of a metallic material such as Ni, Pt, Co, Er, Y, Yb, Ti, Pd, NiPt or CoNi, and silicon. When the gate electrode 13 is constituted by no metal gate electrode, the silicide layer can be formed by silicidizing a predetermined region of an upper portion of the gate electrode 13. In addition, the gate electrode 13 can also be formed in the firm of a full silisude gate electrode by silicidizing the entire gate electrode 13.

FIGS. 2A to 2I show respectively cross sectional views of steps of fabricating the semiconductor device according to the embodiment of the invention.

Figure 2A:
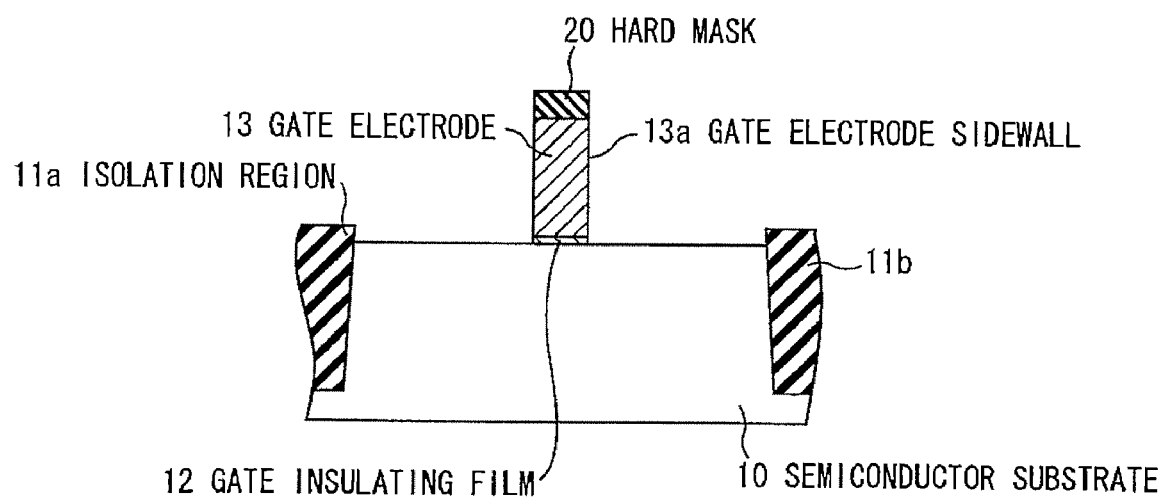
FIGS. 2A to 2I are respectively cross sectional views showing steps of fabricating the semiconductor device according to the embodiment of the invention.

Firstly, as shown in FIG. 2A, the isolation region 11a and the isolation region 11b are formed in the semiconductor substrate 10. Subsequently, ions of a predetermined conductivity type impurity are implanted into the surface of the semiconductor substrate 10 by utilizing the ion implantation method, thereby forming a well region (not shown). It is noted that ions of a predetermined conductivity type impurity can also be implanted into a region in which the channel region 15 is intended to be formed. Subsequently, a heat treatment is performed for the semiconductor substrate 10 by utilizing a heat treatment method such as Rapid Thermal Annealing (RTA). As a result, the conductivity type impurity implanted into the semiconductor substrate 10 is activated.

Note that, when the p-channel transistor is formed by utilizing the ion implantation method described above, n-type impurity ions (such as ions of As, P or the like) are implanted as the conductivity type impurity ions into the surface of the semiconductor substrate 10, thereby forming an n-type well region. On the other hand, when the n-channel transistor is formed by utilizing the ion implantation method described above, p-type impurity ions (such as ions of B, $BF_2$ or the like) are implanted as the conductivity type impurity ions into the surface of the semiconductor substrate 10, thereby forming a p-type well region.

Next, the gate insulating film 12, the gate electrode 13, and a hard mask 20 are formed in order on the surface of the semiconductor substrate 10. Subsequently, firstly, a material film (such as a $SiO_2$ film) of which the gate insulating film 12 is intended to be made, a material film (such as a polycrystalline Si film) of which the gate electrode 13 is intended to be made, and a material film (such as a SiN film or a $SiO_2$ film) of which the hard mask 20 is intended to be made are formed in this order on the surface of the semiconductor substrate 10 by utilizing either a thermal oxidation method or a Low Pressure Chemical Vapor Deposition (LPCVD) method.

It is noted that when the material film of which the gate electrode 13 is made is the polycrystalline Si film, after the material film of which the gate electrode 13 is intended to be made is formed, ions of a predetermined conductivity type impurity are implanted into the material film of which the gate electrode 13 is intended to be made by utilizing the ion implantation method. With regard to the ions of the conductivity type impurity thus implanted, p-type impurity ions are used when the p-channel transistor is formed, and n-type impurity ions are used when the n-channel transistor is formed.

The material film of which the hard mask 20 is made, the material film of which the gate electrode 13 is made, and the material film of which the gate insulating film 12 is made are selectively etched in order by utilizing any suitable one of a photolithography method, an X-ray lithography method or an electron beam lithography method, and a Reactive Ion Etching (RIE) method. As a result, the gate electrode 13 having gate electrode sidewalls 13a on both sides thereof as shown in FIG. 2A is formed in a predetermined position on the surface of the semiconductor substrate 10 through the gate insulating film 12.

Figure 2B:
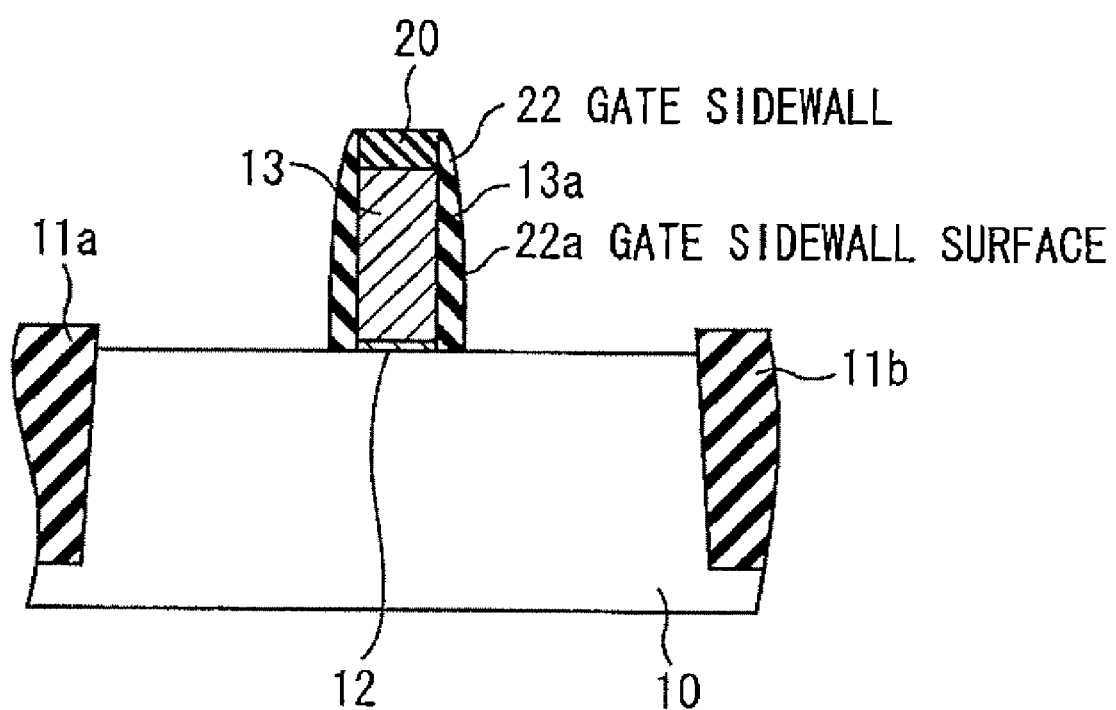

Next, as shown in FIG. 2B, gate sidewalls 22 are formed as offset spacers on the gate electrode sidewalls 13a, respectively. Each of the gate sidewalls 22, for example, is formed as follows. That is to say, firstly, a $SiO_2$ film is formed so as to cover the gate insulating film 12, the gate electrode 13, and the hard mask 20 by utilizing the thermal oxidation method. Subsequently, a material film (such as a SiN film) of which each of the gate sidewalls 22 is intended to be made is formed on the $SiO_2$ film thus formed by utilizing the LPCVD method. Also, the material film of which each of the gate sidewalls 22 is made is selectively etched by utilizing the RIE method, thereby forming the gate sidewalls 22. Here, a thickness from a surface of each of the gate electrode sidewalls 13a to corresponding one of gate sidewall surfaces 22a is preferably thinned to the extend that the short channel characteristics of the semiconductor device 1 finally fabricated are not deteriorated. As an example, each of the gate sidewalls 22 is formed so as to have a thickness in the range of 5 to 15 nm.

Figure 2C:
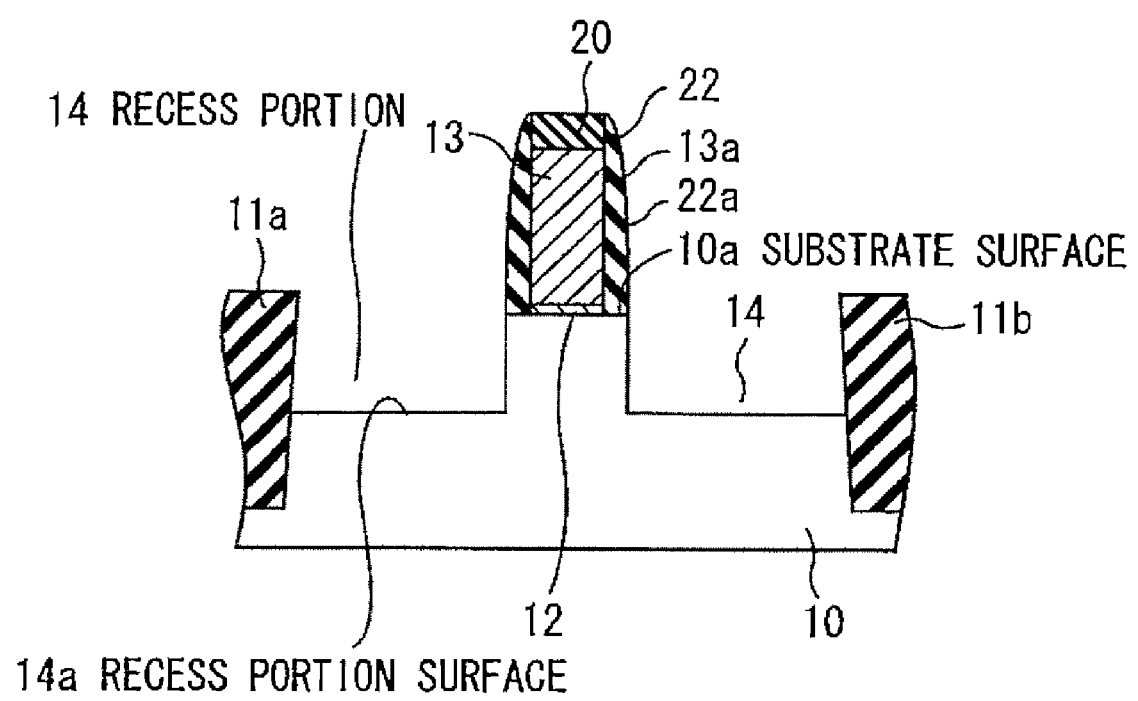

Next, as shown in FIG. 2C, the etching is performed to a predetermined depth from an upper surface of the semiconductor substrate 10 so that a region as the channel region 15 of the semiconductor substrate 10 right under the gate sidewalls 22 and the gate electrode 13 is left. Specifically, at least regions of the semiconductor substrate 10 adjacent to a region in which the channel region 15 is intended to be formed are removed away by performing the etching. As a result, recess portions 14 are formed. Here, the semiconductor substrate 10 is selectively etched so that a distance from a recess portion surface 14a as a bottom portion of each of the recess portions 14 to a substrate surface 10a of the semiconductor substrate 10, as an example, becomes about 90 nm. Note that, it is preferable in terms of simplification of the fabrication processes that the etching is performed so as to leave only the region of the semiconductor substrate 10 right under the gate sidewalls 22 and the gate electrode 13. However, for example, portions of the semiconductor substrate 10 near the isolation region 11a and the isolation 11b need not to be removed as long as at least the predetermined region of the semiconductor substrate 10 adjacent to the region in which the channel region 15 is intended to be formed is removed.

Figure 2D:
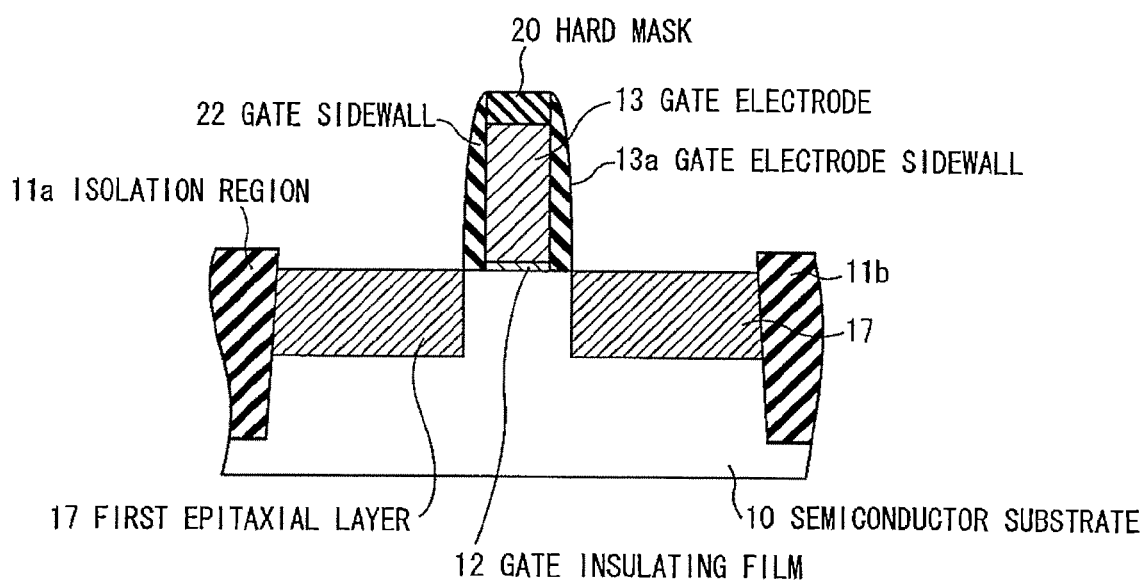

Subsequently, as shown in FIG. 2D, SiGe layers as the first epitaxial layers 17 are grown so as to be filled in the recess portions 14, respectively, by utilizing a vapor phase epitaxial growth method. For example, a SiGe crystal is epitaxially grown under a predetermined temperature environment in a hydrogen gas ambient atmosphere by using silane ($SiH_4$) as a Si raw material, and germane ($GeH_4$) as a Ge raw material, thereby forming each of the SiGe layers as the first epitaxial layers 17. In this case, surface roughness of each of the first epitaxial layers 17 is preferably reduced as much as possible for the purpose of reducing the surface roughness in the phase of the etching for each of the first epitaxial layers 17 which will be described below. For example, the surface roughness of each of the first epitaxial layers 17 is preferably set within a predetermined value by adjusting the growth conditions for each of the first epitaxial layers 17. As an example, for the surface roughness of each of the first epitaxial layers 17, about 10% of a depth to which each of the second epitaxial layers 18 as extension portions is formed (for example, about 1.5 nm when the depth to which each of the second epitaxial layers 18 as the extension portions is formed is 15 nm) becomes an allowable range.

Figure 2E:
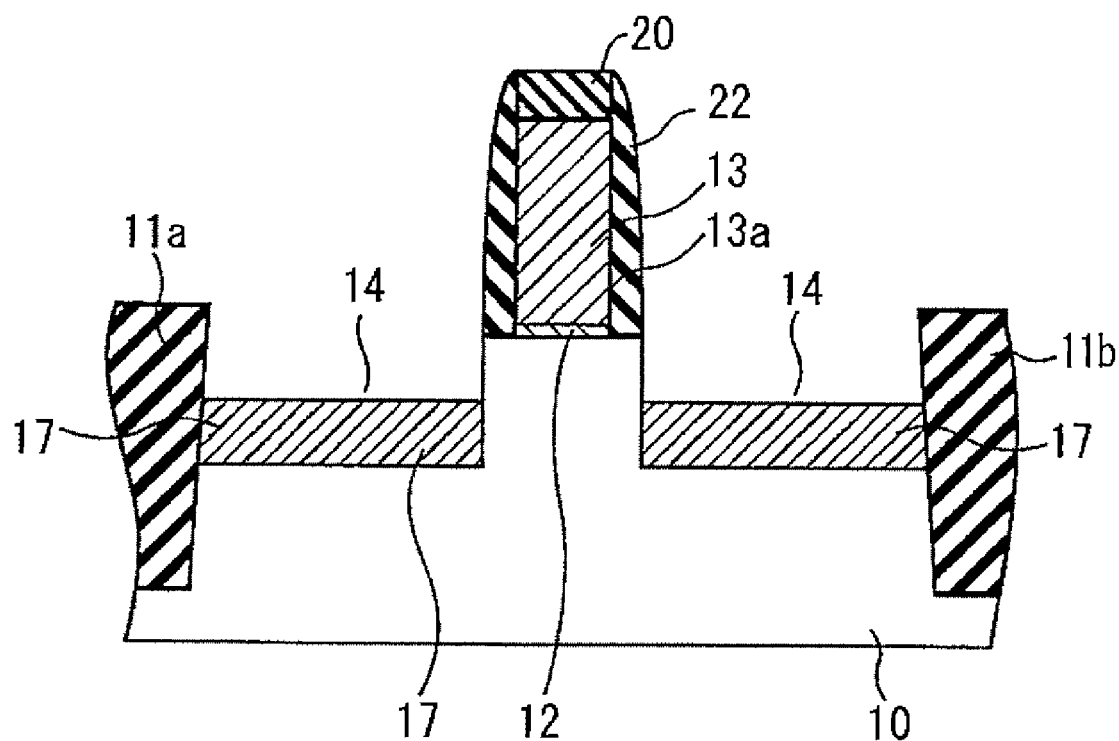

Next, as shown in FIG. 2E, each of the first epitaxial layers 17 is etched toward the semiconductor substrate 10 side so as to leave to a predetermined thickness by utilizing the RIE method or the like. Here, each of the first epitaxial layers 17 is etched so that at least a portion of each of the first epitaxial layers 17 adjacent to the channel region 15 is removed. In addition, each of the first epitaxial layers is etched to a depth corresponding to a depth to which each of the second epitaxial layers 18 as the extension portions is intended to be formed. As an example, each of the first epitaxial layers 17 is etched to a depth of 15 to 20 nm from a surface of each of the first epitaxial layers 17. As a result, side surfaces of the channel region 15 of the semiconductor substrate 10 are exposed.

Figure 2F:
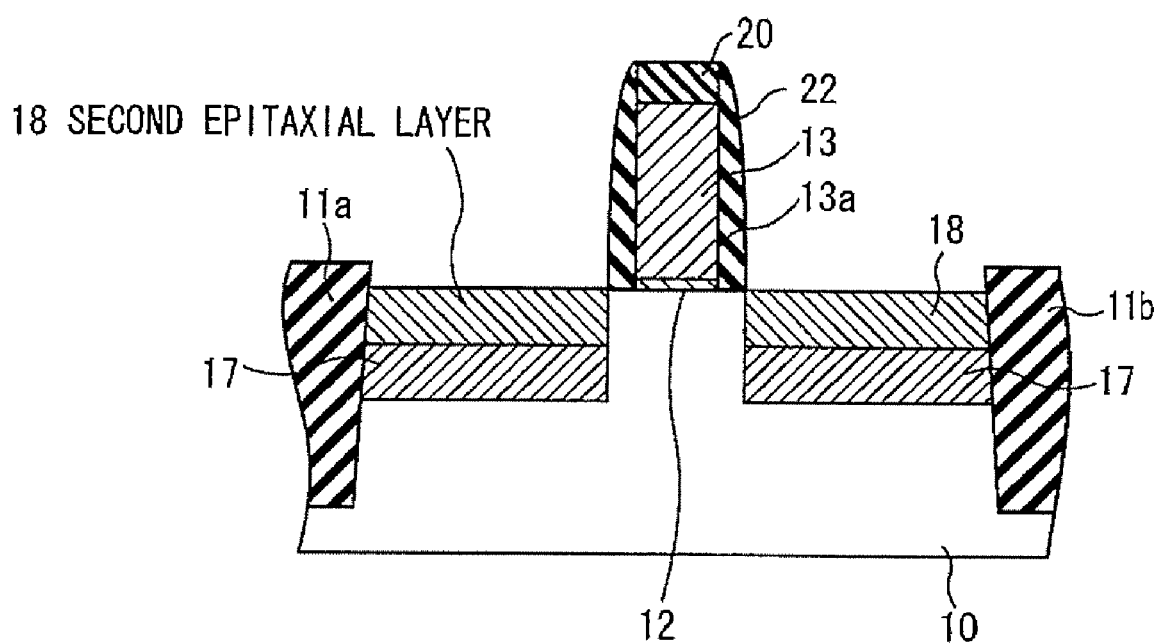

Subsequently, as shown in FIG. 2F, the second epitaxial layers 18 as the extension portions are epitaxially grown on the first epitaxial layers 17, respectively. Specifically, SiGe layers into each of which B ions are implanted as conductivity type impurity ions are epitaxially grown as the second epitaxial layers 18, respectively. That is to say, the SiGe layers, each containing therein B, as the second epitaxial layers each having a thickness corresponding to the depth to which each of the first epitaxial layers 17 is etched in the step shown in FIG. 2E are formed on the first epitaxial layers 17, respectively.

Figure 2G:
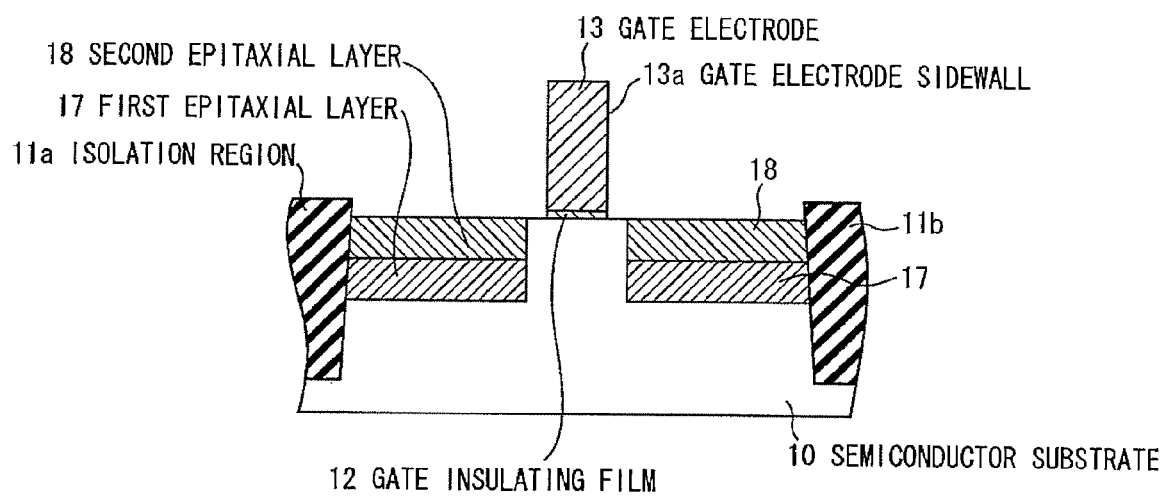
Figure 2H:
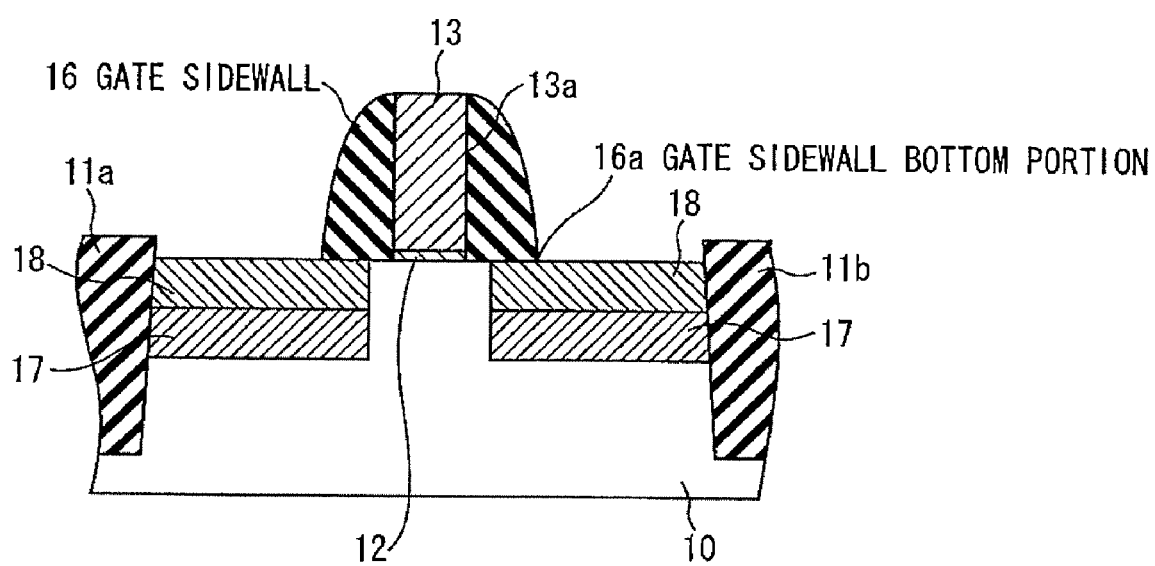

Next, as shown in FIG. 2G, the hard mask 20 and the gate sidewalls 22 are removed. For example, the gate sidewalls 22 are removed by utilizing a wet etching method using a predetermined etchant. Also, as shown in FIG. 2H, the gate sidewalls 16 as spacers for the source/drain regions, and the silicide layer are formed on the gate electrode sidewalls 13a, respectively.

The gate sidewalls 16, for example, are formed as follows. That is to say, firstly, a $SiO_2$ film is formed so as to cover the gate insulating film 12 and the gate electrode 13 by utilizing the thermal oxidation method. Subsequently, a material film (such as a $SiO_2$ film or a SiN film) of which each of the gate sidewalls 22 is intended to be made is formed on the $SiO_2$ film thus formed by utilizing the LPCVD method. Also, the material film of which each of the gate sidewalls 22 is intended to be made is selectively etched, thereby forming the gate sidewalls 16. Here, each of the gate sidewalls 16 is formed so that a distance from the gate electrode sidewall 13a to a gate sidewall bottom portion 16a, that is, a maximum value of a width of each of the gate sidewalls 16 becomes about 30 nm. Therefore, the second epitaxial layers 18 as the extension portions get into portions under the gate sidewalls 16, respectively, by 15 to 25 nm.

It is noted that when the silicide layer is formed on the gate electrode 13, it can be formed as follows. For example, firstly, after a natural oxide film formed in a region through which the gate electrode 13 is exposed is removed by performing a hydrofluoric acid treatment, the region through which the gate electrode 13 is exposed is covered with a metallic film. A Ni film or the like, as an example, is given as the metallic film, and a sputtering method, as an example, is given as a method for forming the metallic film. Also, after the metallic film is formed, the metallic film and the upper portion of the gate electrode 13 are silicidized with each other by performing the RTA. As a result, the silicide layer is formed on the gate electrode 13. In addition, a portion of the metallic film thus formed which is not silicidized with the upper portion of the gate electrode 13 is etched away by using an etchant obtained by mixing sulfuric acid and hydrogen peroxide with each other at a predetermined ratio.

Figure 2I:
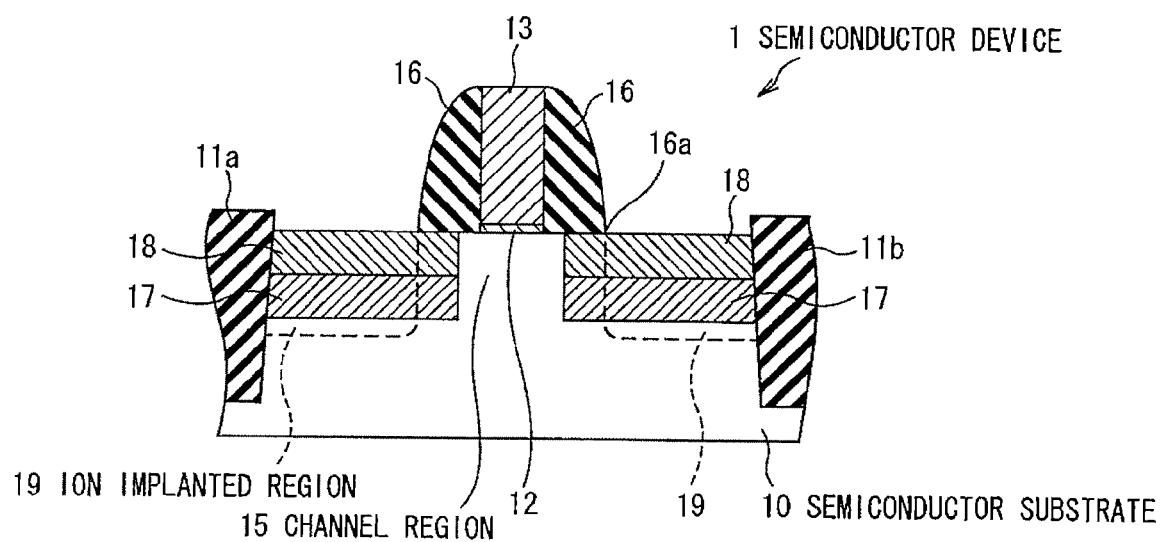

Subsequently, as shown in FIG. 2I, ions of a predetermined conductivity type impurity are implanted into the second epitaxial layers 18 from a direction vertical to each of upper surfaces of the second epitaxial layers 18 with the gate sidewalls 6 as a mask by utilizing the ion implantation method or the like. An ion implanted region 19 becomes a high impurity concentration region because the conductivity type impurity ions at this time are implanted at a higher concentration than that at which the conductivity type impurity ions are implanted in situ into the second epitaxial layers 18. As a result, the ion implanted regions 19 as the source/drain regions are formed. Also, the semiconductor device 1 according to this embodiment is fabricated.

Figure 3A:
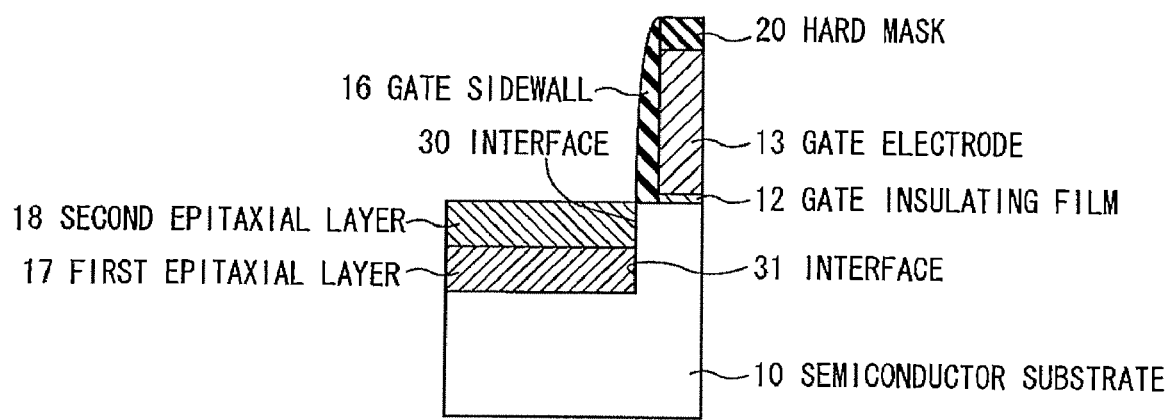
FIG. 3A is a partial cross sectional view of the semiconductor device according to the embodiment of the invention.
Figure 3B:
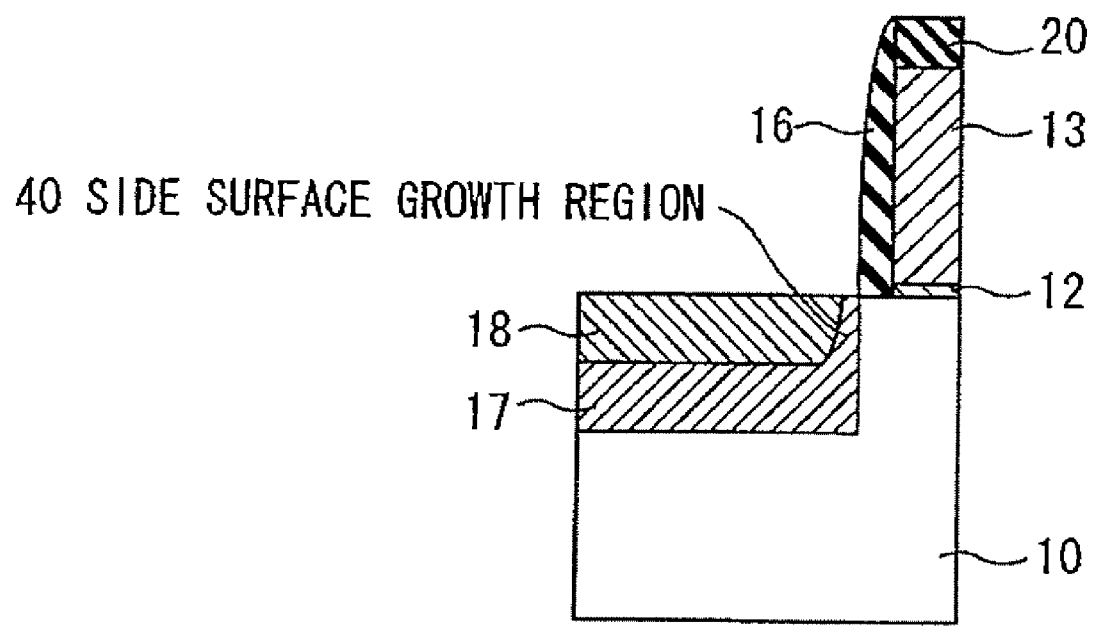
FIG. 3B is a partial cross sectional view of a semiconductor device according to a comparative example.

FIG. 3A shows a partial cross sectional view of the semiconductor device according to the embodiment, and FIG. 3B shows a partial cross sectional view of a semiconductor device according to a comparative example.

As shown in FIG. 3A, in the semiconductor device 1 according to the embodiment, one end portion of the first epitaxial layer 17, and one end portion of the second epitaxial layer 18 each contact the semiconductor substrate 10. That is to say, the first epitaxial layer 17 contacts in one end portion thereof the semiconductor substrate 10 to form an interface 31 between them. Likewise, the second epitaxial layer 18 contacts in one end portion thereof the semiconductor substrate 10 to form an interface 30 between them. As a result, the interface between the second epitaxial layer 18 containing therein the conductivity type impurity, and the semiconductor substrate 10 can be defined in the surface of the gate sidewall 16.

In the semiconductor device 1 according to the embodiment, the first epitaxial layer 17 made of SiGe is epitaxially grown, and a part of the upper region of the first epitaxial layer 17 is etched away by utilizing the RIE method. After that, the second epitaxial layer of SiGe containing therein B is epitaxially grown on the first epitaxial layer 17. Therefore, both the one end portion of the first epitaxial layer 17, and the one end portion of the second epitaxial layer 18 contact the semiconductor substrate 10.

On the other hand, a structure similar to that of the semiconductor device 1 according to the embodiment, as shown in FIG. 3B relating to the comparative example, can be formed by changing the relative proportion of Ge in the middle of the growth when the first epitaxial layer 17 is epitaxially grown. In this case, however, a side surface growth region 40 is formed because the crystal is grown not only from a bottom surface of the recess portion 14 of the semiconductor substrate 10 right under the gate sidewall 16, but also from the side surface. The reason for this is because although the first epitaxial layer 17 is epitaxially grown preferentially from the bottom surface of the recess portion 14 as a (100) surface orientation because a speed of the crystal growth from the side surface of the recess portion 14 as the (110) surface orientation is slower than that of the crystal growth from the bottom portion of the recess portion 14 as a (100) surface orientation, the speed of the crystal growth from the side surface of the recess portion 14 as the (110) surface orientation is hard to be controlled to zero.

The side surface growth region 40 shown in FIG. 3B has a high resistivity because it is a part of the first epitaxial layer 17 and is made of SiGe. Therefore, it is preferable as in the embodiment previously described with reference to FIGS. 2A to 2I that after the predetermined region of the upper portion of the first epitaxial layer 17 is removed by utilizing the RIE method, the second epitaxial layer 18 is formed on the first epitaxial layer 17, thereby forming a two-stage structure having the SiGe layer as the first epitaxial layer 17 and the SiGe layer, containing therein B, as the second epitaxial layer 18.

According to the semiconductor device 1 of the embodiment, the recess portion 14 as a recess is formed in the position near the gate electrode 13 through formation of the gate sidewall 22, and after the region of the first epitaxial layer 17 in which the second epitaxial layer 18 is intended to be formed is etched away after formation of the first epitaxial layer 17, the second epitaxial layer 18 is formed. Therefore, the second epitaxial layer 18 having the steep impurity concentration profile in the junction interface can be made close to the channel region 15 while an amount of strain applied to the channel region 15 is maintained at desired one. As a result, it is possible to provide the semiconductor device 1 in which the deterioration of the short channel characteristics, and the deterioration of the strain are suppressed, and thus a parasitic resistance is reduced.

Although the embodiments have been described so far, the embodiments described above do not limit the invention disclosed in the appended claims.

For example, a SiGe layer in which Si ions are implanted to increase a Si concentration in the vicinity of the surface, thereby making the silicidization of the surface easy may also be formed as the second epitaxial layer 18. In addition, the second epitaxial layer 18 can also be formed by gradually changing the concentration of the conductivity impurity implanted along a direction from the first epitaxial layer 17 to the gate electrode 13.

In addition, all the combinations of the features described above in the embodiments are not necessarily essential to the means for solving the problems that the invention is to solve.

What is claimed is:

1. A method of fabricating a semiconductor device, comprising:
    forming a gate electrode on a semiconductor substrate through a gate insulating film;

forming offset spacers on side surfaces of the gate electrode, respectively;

etching the semiconductor substrate with a channel region below the offset spacers and the gate electrode being left by using the offset spacers as a mask;

forming a first epitaxial layer made of a crystal having a lattice constant different from that of a crystal constituting the semiconductor substrate on the semiconductor substrate thus etched; etching at least a portion of the first epitaxial layer adjacent to the channel region to a predetermined depth from a surface of the first epitaxial layer toward the semiconductor substrate side; and forming a second epitaxial layer containing therein a conductivity type impurity on the first epitaxial layer thus etched.

2. The method of fabricating a semiconductor device according to claim 1, wherein in the etching of the first epitaxial layer, the first epitaxial layer having a predetermined thickness and including at least a portion adjacent to the channel region is etched, thereby exposing a side surface of the channel region.

3. The method of fabricating a semiconductor device according to claim 1, wherein the first epitaxial layer is etched by utilizing Reactive Ion Etching (RIE) method.

4. The method of fabricating a semiconductor device according to claim 1, wherein the first epitaxial layer contains therein a conductivity type impurity having a first concentration, and the second epitaxial layer contains therein a conductivity type impurity having a second concentration higher than the first concentration.

5. The method of fabricating a semiconductor device according to claim 4, wherein the first concentration is a concentration at which the conductivity type impurity is not substantially contained.

6. The method of fabricating a semiconductor device according to claim 1, wherein the second epitaxial layer is formed by implanting in situ the conductivity type impurity.

7. The method of fabricating a semiconductor device according to claim 1, wherein the first epitaxial layer is made of the crystal having the lattice constant larger than that of the crystal constituting the semiconductor substrate.

8. The method of fabricating a semiconductor device according to claim 1, wherein the first epitaxial layer is made of the crystal having the lattice constant smaller than that of the crystal constituting the semiconductor substrate.

9. The method of fabricating a semiconductor device according to claim 1, wherein the first epitaxial layer is a SiGe layer which is formed so as not to contain therein a conductivity type impurity, and the second epitaxial layer is a SiGe layer which is formed so as to contain therein a conductivity type impurity.

10. The method of fabricating a semiconductor device according to claim 9, wherein in the forming of the first epitaxial layer, a relative proportion of Ge is gradually changed from the semiconductor substrate toward the gate electrode side.

11. The method of fabricating a semiconductor device according to claim 10, wherein in the forming of the first epitaxial layer, the relative proportion of Ge is gradually increased from the semiconductor substrate toward the gate electrode side.

12. The method of fabricating a semiconductor device according to claim 1, further comprising:

forming a high impurity concentration region on each of both sides of the channel region away from the channel region so as to include parts of the first epitaxial layer and the second epitaxial layer.

13. The method of fabricating a semiconductor device according to claim 12, wherein in the forming of the high impurity concentration region, the high impurity concentration region is formed by utilizing an ion implantation method.

* * * * *